(12) United States Patent
Matsuura et al.

(10) Patent No.: US 8,710,737 B2
(45) Date of Patent: Apr. 29, 2014

(54) LIGHT-EMITTING DEVICE

(75) Inventors: Shingo Matsuura, Higashiomi (JP);
Tomoya Tabuchi, Higashiomi (JP);
Kousuke Katabe, Higashiomi (JP);
Yuki Mori, Higashiomi (JP); Akira Miyake, Higashiomi (JP); Daisuke Sakumoto, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 943 days.

(21) Appl. No.: 12/294,850

(22) PCT Filed: Mar. 28, 2007

(86) PCT No.: PCT/JP2007/056722
§ 371 (c)(1),
(2), (4) Date: Feb. 12, 2013

(87) PCT Pub. No.: WO2007/111355
PCT Pub. Date: Oct. 4, 2007

(65) Prior Publication Data
US 2013/0200784 A1   Aug. 8, 2013

(30) Foreign Application Priority Data

Mar. 28, 2006 (JP) .................. 2006-089446

(51) Int. Cl.
*H01J 1/62* (2006.01)
(52) U.S. Cl.
USPC .......................................... 313/512; 313/506
(58) Field of Classification Search
USPC .................................. 313/498–512
See application file for complete search history.

(56) References Cited

U.S. PATENT DOCUMENTS

| 6,066,861 A | 5/2000 | Hohn et al. |
| 2002/0011601 A1 | 1/2002 | Furukawa et al. |
| 2002/0163302 A1 | 11/2002 | Nitta et al. ..................... 313/512 |
| 2003/0025117 A1 | 2/2003 | Isokawa et al. ................. 257/79 |
| 2004/0051111 A1 | 3/2004 | Ota et al. |
| 2005/0067628 A1 | 3/2005 | Kuwabara et al. ............. 257/98 |

(Continued)

FOREIGN PATENT DOCUMENTS

| DE | 19638667 A1 | 4/1998 |
| JP | 61-127186 | 6/1986 |

(Continued)

OTHER PUBLICATIONS

Chinese language office action and its English language translation for corresponding Chinese application 201041700032640.

(Continued)

*Primary Examiner* — Anne Hines
(74) *Attorney, Agent, or Firm* — DLA Piper LLP (US)

(57) ABSTRACT

To improve the luminance of light emitted by a light-emitting device, the light-emitting device includes a base (1) that has an opening part (1p) constituted by a light-reflecting surface (1r) and a bottom surface (1u), a light-emitting chip (2) that is mounted on the bottom surface (1u) of the opening part (1p), a transparent member (3) that covers the light-emitting chip (2), and an optical member (4) that is disposed on the transparent member (3). The transparent member (3) is disposed on the bottom surface (1u) of the opening part (1p) in a state where the transparent member (3) is spaced away from the light-reflecting surface (1r) of the opening part (1p).

9 Claims, 15 Drawing Sheets

(56) References Cited

U.S. PATENT DOCUMENTS

| | | | |
|---|---|---|---|
| 2007/0085103 A1 | 4/2007 | Nishioka et al. | 257/99 |
| 2008/0030993 A1* | 2/2008 | Narendran et al. | 362/296 |
| 2008/0074032 A1 | 3/2008 | Yano et al. | |

FOREIGN PATENT DOCUMENTS

| | | |
|---|---|---|
| JP | 2001-036147 | 2/2001 |
| JP | 2002-314142 | 10/2002 |
| JP | 2003-282955 | 10/2003 |
| JP | 2003-303999 | 10/2003 |
| JP | 2005-109172 | 4/2005 |
| JP | 2005-158949 | 6/2005 |
| JP | 2006-013198 | 1/2006 |
| WO | 2005104247 A1 | 11/2005 |

OTHER PUBLICATIONS

German language office action and its English language translation for corresponding German application 112007000775.3.

* cited by examiner

FIG. 8
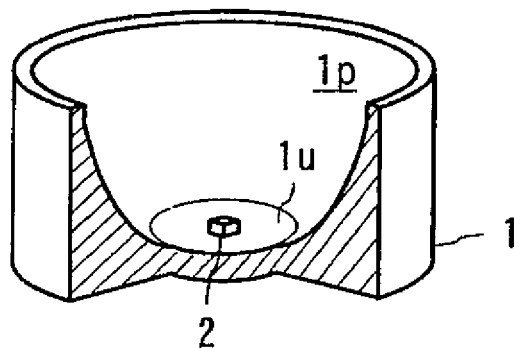
(a)
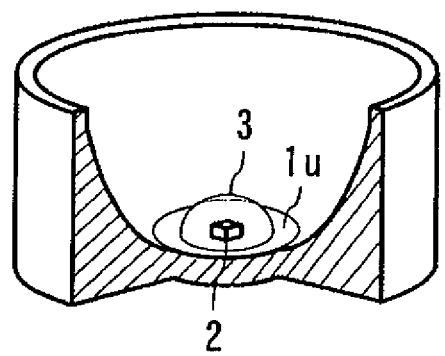
(b)
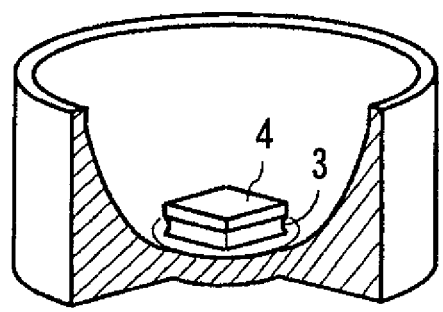
(c)
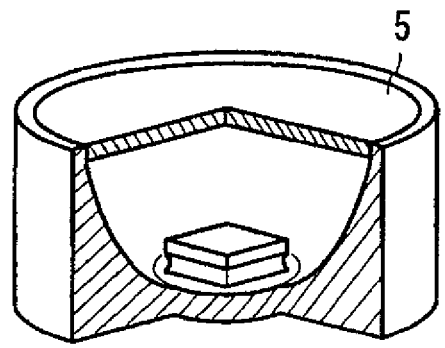
(e)

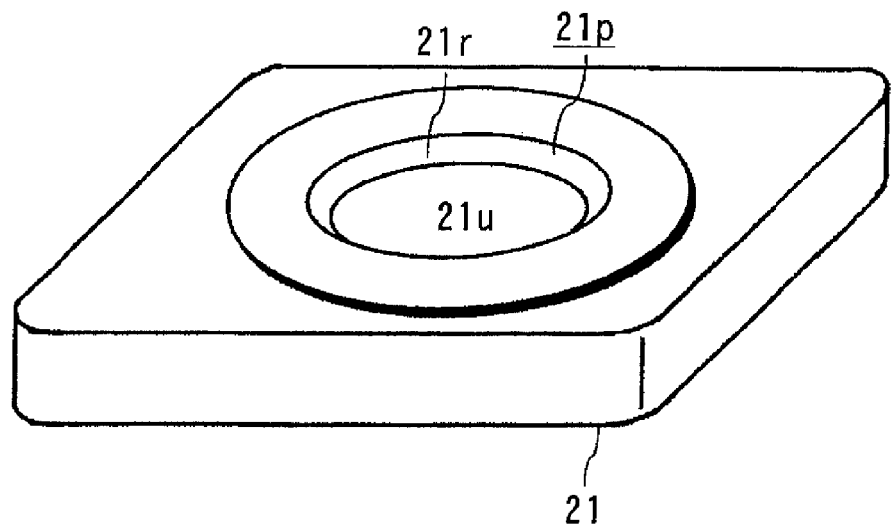
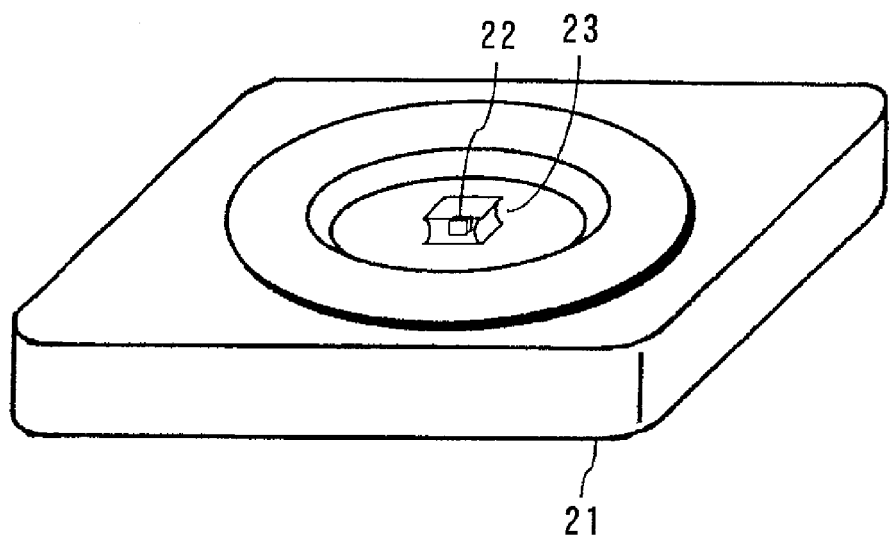

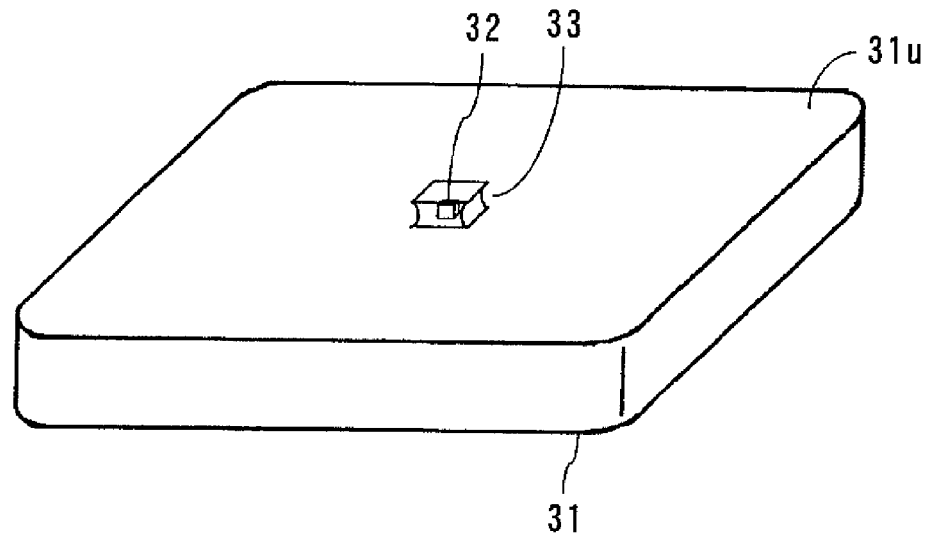

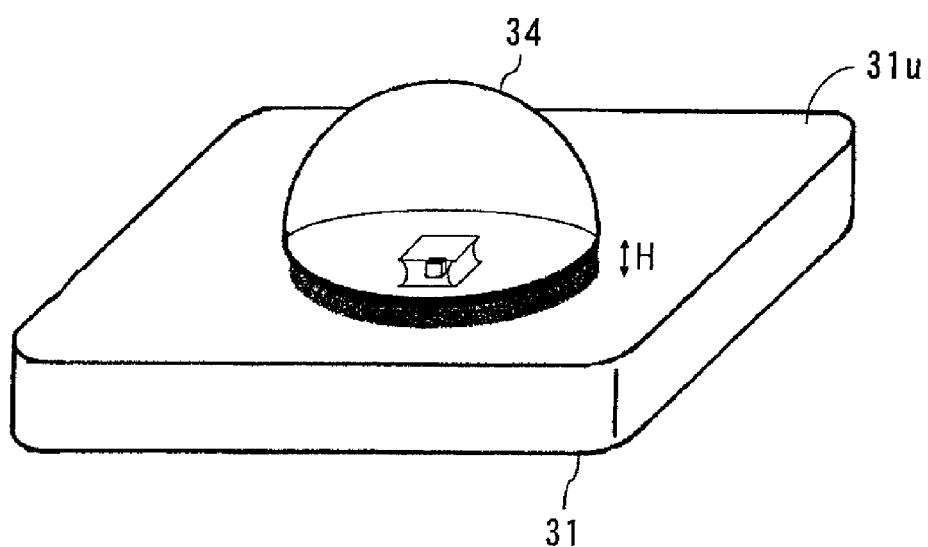

FIG. 20
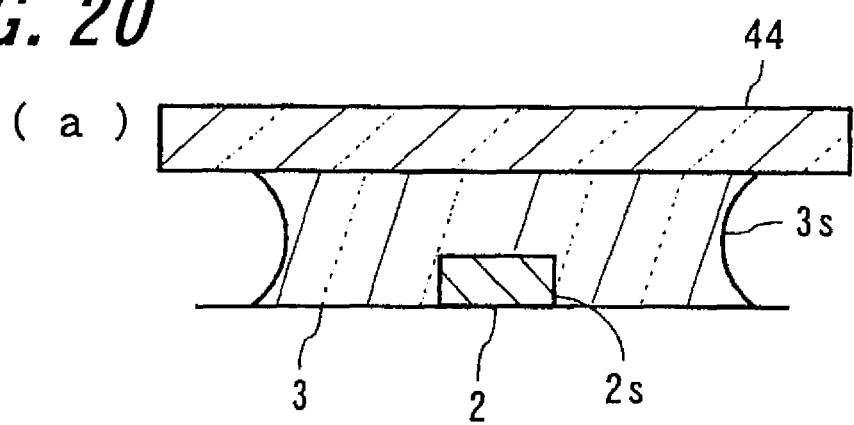
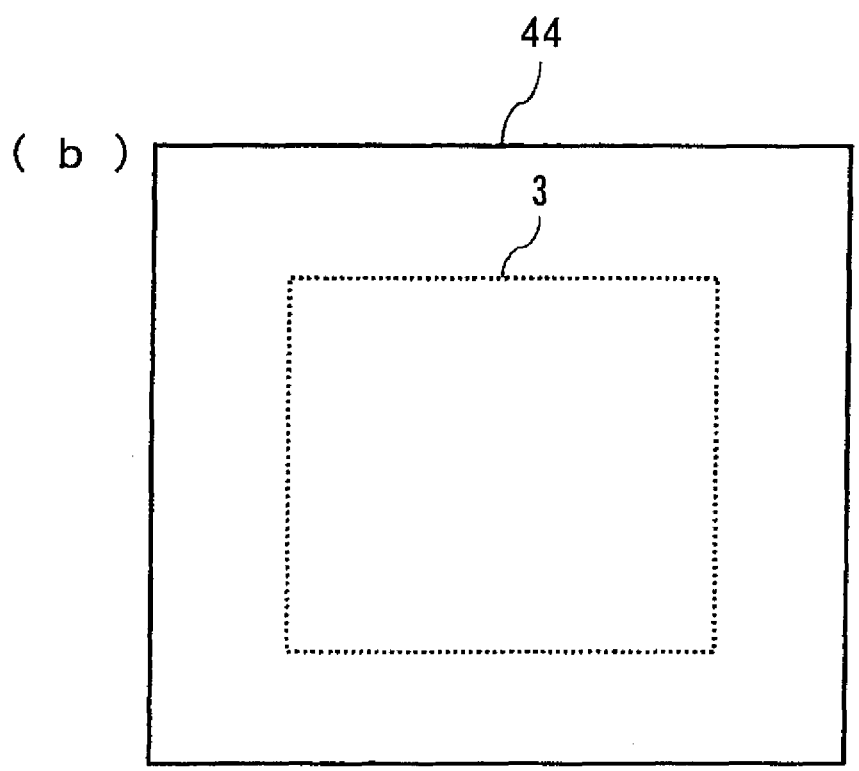

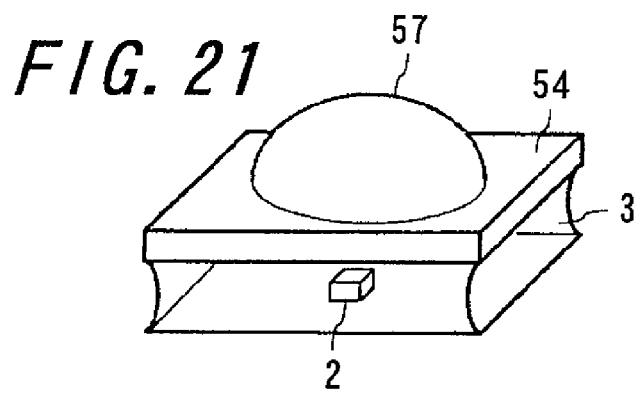
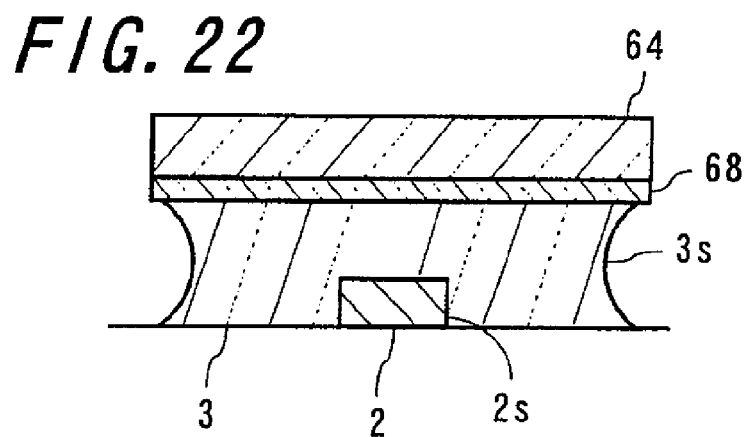
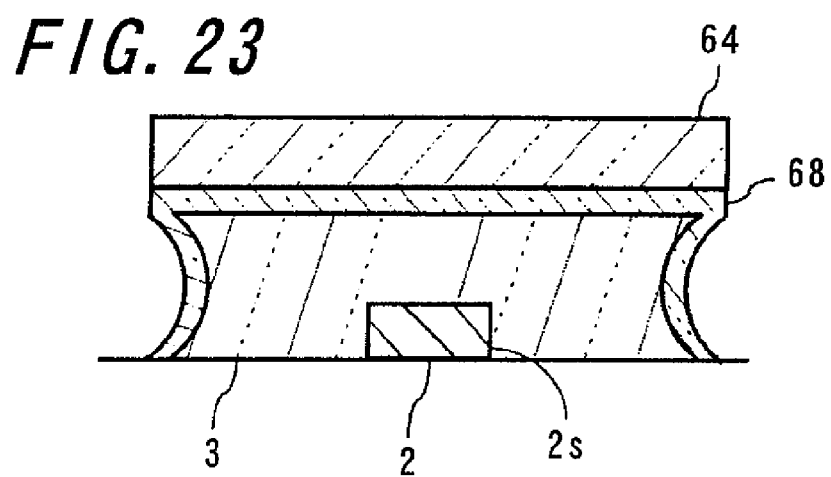

US 8,710,737 B2

LIGHT-EMITTING DEVICE

CROSS-REFERENCE TO THE RELATED APPLICATIONS

This application is a national stage of international application No. PCT/JP2007/056722 filed Mar. 28, 2007, which also claims the benefit of priority under 35 USC 119 to Japanese Patent Application No. 2006-089446 filed Mar. 28, 2006, the entire contents of all of which are incorporated herein by reference.

TECHNICAL FIELD

The present invention relates to light-emitting devices having a light source such as a light-emitting diode chip.

BACKGROUND ART

Recently, for example, as light-emitting devices of lighting apparatus, devices having a light-emitting diode lamp or the like are being developed. In these light-emitting devices having a light-emitting diode lamp, a fluorescent material is used to convert a light generated by the light-emitting diode chip or the like into light having a different wavelength, thereby generating an output light such as white light. This sort of lighting apparatus having a light-emitting diode chip or the like is expected to have a lower power consumption and a longer life.
Patent Document 1: Japanese Unexamined Patent Publication JP-A 2003-282955

DISCLOSURE OF INVENTION

Technical Problem

In a situation where the light-emitting devices having a light source such as a light-emitting diode chip described above are expected to be more widely used, it is important to improve the luminance of emitted light. In order to improve the luminance of emitted light, it is important to improve the efficiency in collecting light generated by the light source.

The invention was devised in view of this sort of problem, and it is an object thereof to improve the luminance of light emitted by a light-emitting devices.

Technical Solution

A light-emitting device includes a base that has an opening part constituted by a light-reflecting surface and a bottom surface; a light-emitting chip that is mounted on the bottom surface of the opening part; a transparent member that covers the light-emitting chip; and an optical member that is disposed on the transparent member. The transparent member is disposed on the bottom surface of the opening part in a state where the transparent member is spaced away from the light-reflecting surface of the opening part.

Advantageous Effects

The transparent member is provided that is disposed on the bottom surface of the opening part in a state where the transparent member is spaced away from the light-reflecting surface of the opening part. Accordingly, the efficiency in guiding light generated by the light-emitting chip, in the light-emitting direction, can be improved, and thus the luminance of light emitted by the light-emitting device can be improved.

BRIEF DESCRIPTION OF DRAWINGS

FIG. 8 is a perspective view illustrating a manufacturing method of the first embodiment.
FIG. 11 is a perspective view illustrating a configuration of a base 21 in the second embodiment.
FIG. 12 is a perspective view illustrating a configuration of a transparent member 23 in the second embodiment.
FIG. 20 is a view illustrating a configuration of a fourth embodiment.
FIG. 21 is a perspective view illustrating a configuration of a fifth embodiment.
FIG. 22 is a cross-sectional view illustrating a configuration of a sixth embodiment.
FIG. 23 is a cross-sectional view illustrating another configuration of the sixth embodiment.

BEST MODE FOR CARRYING OUT THE INVENTION

Figure 1:
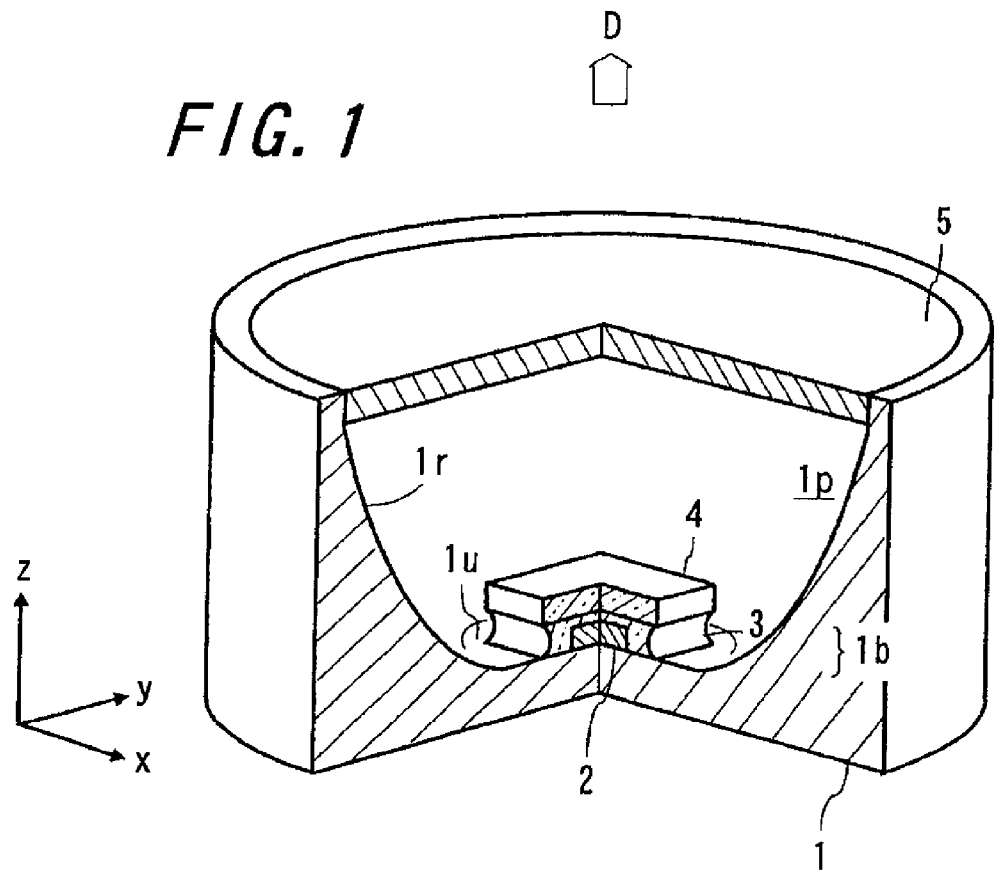
FIG. 1 is a perspective view illustrating a configuration of a first embodiment.
Figure 2:
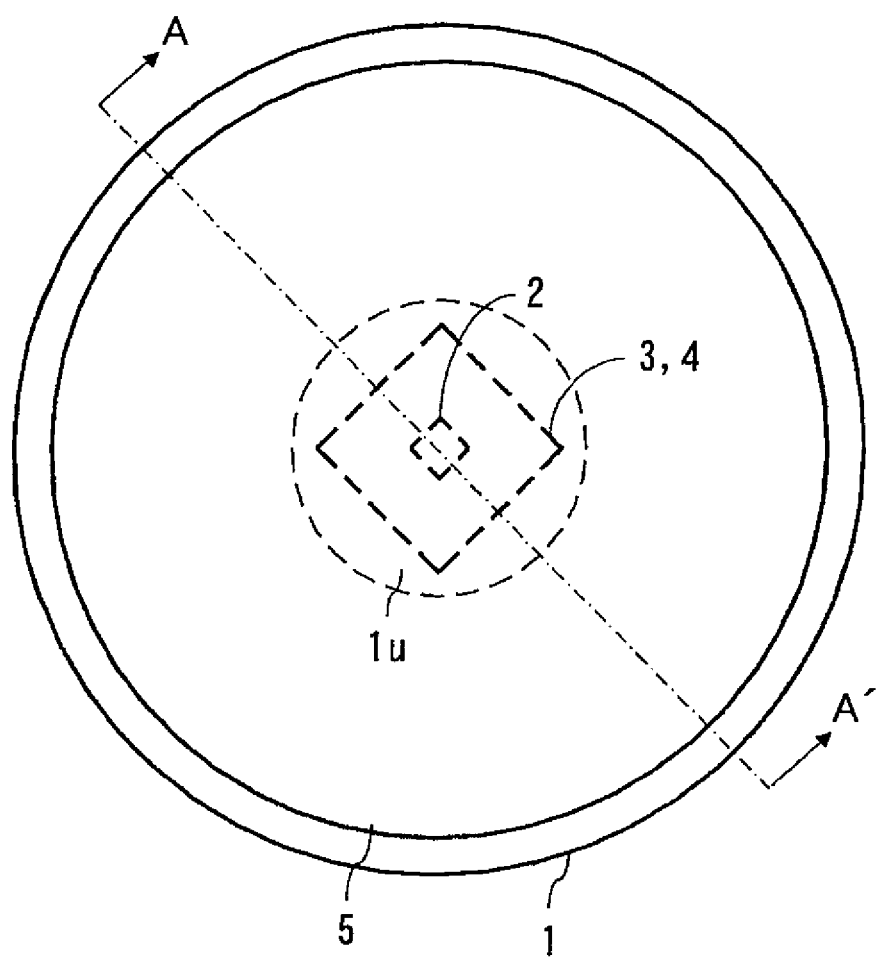
FIG. 2 is a transparent plan view illustrating a configuration of the first embodiment.
Figure 3:
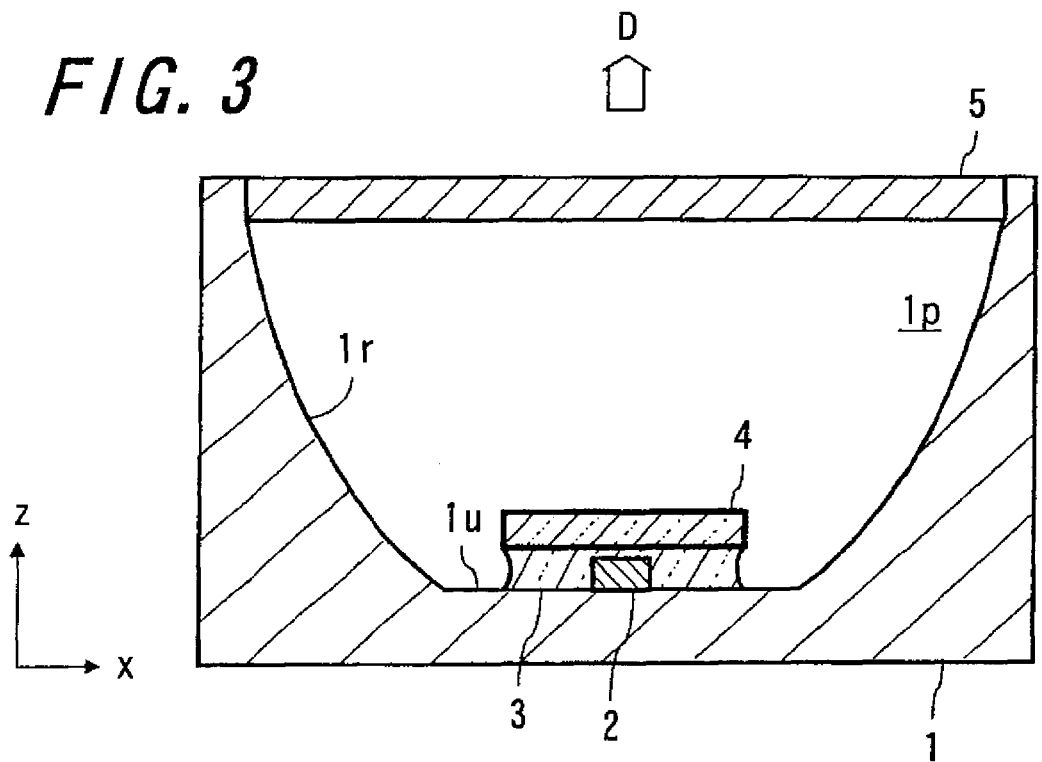
FIG. 3 is a cross-sectional view illustrating a configuration of the first embodiment.

Now referring to the drawings, preferred embodiments of the invention are described below.
(First Embodiment)
A first embodiment of the invention will be described with reference to FIGS. 1 to 3. FIG. 1 is a perspective view illustrating the configuration of a light-emitting device according to the first embodiment. In FIG. 1, the configuration of the light-emitting device is partially cut away in order to illustrate the internal configuration of the light-emitting device. FIG. 2 is a transparent plan view of the light-emitting device illustrated in FIG. 1 viewed from the side of a wavelength converter. In FIG. 2, constituent elements that can be seen through the outer portion are indicated by a dotted line. FIG. 3 is a cross-sectional view of the light-emitting device taken along line A-A' illustrated in FIG. 2.

The light-emitting device of this embodiment includes a base 1, a light-emitting chip (light source) 2 that is mounted on the base 1, a transparent member 3 that covers the light-emitting chip 2, and an optical member 4 that is disposed on the transparent member 3. The light-emitting device of this embodiment further includes a wavelength converter (wavelength-converting means) 5 that covers the optical member 4. Here, covering the optical member 4 refers to a state in which the wavelength converter 5 is disposed at a position where light emitted from the optical member 4 reaches.

In this embodiment, the base 1 has an opening part 1p including a light-reflecting surface 1r and a bottom surface 1u. Here, the light-reflecting surface 1r of the base 1 reflects light having at least part of wavelengths of the light generated by the light-emitting chip 2, in a light-emitting direction D. The light-emitting direction D refers to a direction in which light outputted from the light-emitting device travels, and is an upward direction in FIG. 1 (the positive direction in a z axis of virtual xyz coordinate). In FIG. 1, the light-emitting device is illustrated in a state where the light-emitting device is mounted on an xy plane of the virtual xyz coordinate. On the surface (the bottom surface 1u) of the base 1, first and second connecting pads are arranged that correspond to a plurality of electrodes formed on the light-emitting chip 2 and are electrically connected to the plurality of electrodes.

Figure 4:
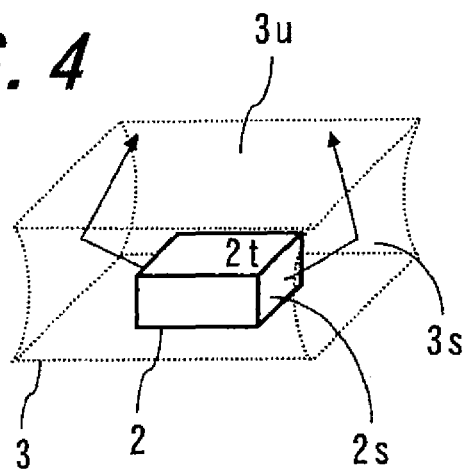
FIG. 4 is a perspective view illustrating a configuration of a transparent member 3 in the first embodiment.

As illustrated in FIG. 4, the light-emitting chip 2 is a light-emitting diode having a top 2t and a side surface 2s, and is disposed at a bottom part 1b of the opening part 1p of the base 1. In the configuration illustrated in FIG. 1, the light-emitting chip 2 is mounted on the bottom surface 1u of the opening part 1p of the base 1, and emits light at least from the side surface 2s. The light-emitting chip 2 generates light having at least part of wavelengths in the range of 210 to 470 nm.

In this embodiment, the light-emitting chip 2 is a light-emitting diode that includes a substrate, an n-type semiconductor layer, a light-emitting layer, and a p-type semiconductor layer. An n-side electrode and a p-side electrode are arranged respectively on the n-type semiconductor layer and the p-type semiconductor layer of the light-emitting chip 2. The light-emitting chip 2 is configured so as to emit light at least laterally (in the directions that are perpendicular to a stacking direction). In FIG. 1, the stacking direction of the light-emitting chip 2 refers to the z-axis direction of the virtual coordinate, and the lateral direction of the light-emitting chip 2 refers to an x-axis direction, a y-axis direction, and the like of the virtual coordinate.

The light-emitting chip 2 is, for example, a light-emitting diode made of a ZnO-based oxide semiconductor, and generates first light having a peak wavelength in the wavelength range of 230 to 450 nm. Other examples of the light-emitting chip 2 include compound semiconductors such as silicon carbide (SiC)-based compound semiconductor, diamond-based compound semiconductor, and boron nitride-based compound semiconductor.

In this embodiment, the transparent member 3 covers the light-emitting chip 2, and is disposed on the bottom surface 1u of the opening part 1p in a state where the transparent member 3 is apart from the light-reflecting surface 1r of the opening part 1p. Here, covering the light-emitting chip 2 refers to a state in which the transparent member 3 covers at least part of the side surface 2s of the light-emitting chip 2. In the configuration illustrated in FIG. 4, the transparent member 3 surrounds the side surface 1s and the top 1t of the light-emitting chip 2. The transparent member 3 has a side surface 3s and an upper surface 3u that adheres to the optical member 4, and has a function to guide light emitted from the side surface 2s of the light-emitting chip 2, in the light-emitting direction D. The side surface 3s of the transparent member 3 is light-reflecting means having a function to guide light emitted from the side surface 2s of the light-emitting chip 2 by means of total reflection in the light-emitting direction D.

The transparent member 3 is made of a transparent material such as a silicone resin, an epoxy resin, or an organic or inorganic hybrid resin, and partially disposed at the bottom part 1b of the opening part 1p of the base 1 so as to cover the light-emitting chip 2. Here, transparent refers to a property that allows light having at least part of wavelengths of the light generated by the light-emitting chip 2 to pass. The transparent member 3 is preferably made of a silicone resin. A silicone resin is superior in heat resistance to an epoxy resin or the like, and thus reduces the influence of heat generated by the light-emitting chip 2. Heat denaturation (e.g., a change in the color) of the optical member 4 is reduced by using the transparent member 3 that has excellent heat resistance.

The transparent member 3 is disposed at the bottom part 1b of the opening part 1p so as to be in contact with the side surface 2s of the light-emitting chip 2 and a bottom surface of the optical member 4. That is, the transparent member 3 is apart from an inner surface of the opening part 1p of the base 1, and covers the bottom surface of the optical member 4 and the side surface 2s of the light-emitting chip 2. The transparent member 3 has a function to guide light emitted from the side surface 2s of the light-emitting chip 2, to the optical member 4. In a case where a refractive index of the transparent member 3 is taken as n1, and a refractive index of a layer (an air layer in FIG. 1) between the transparent member 3 and the inner surface of the opening part 1p of the base 1 is taken as n2, the refractive indexes n1 and n2 satisfy the relationship n1>n2. In FIG. 1, the side surface 3s of the transparent member 3 is in contact with the space (the air layer) having a refractive index smaller than that of the transparent member 3.

In the light-emitting device in this embodiment, the transparent member 3 adheres to both the bottom surface of the optical member 4 and the bottom surface 1u of the base 1 so as to be interposed between the optical member 4 and the transparent member 3. The side surface 3s of the transparent member 3 is formed so as to extend from the surface of the optical member 4 to the surface of the base 1. With this configuration, energy loss is reduced when light emitted laterally from the light-emitting chip 2 is guided upward (in the light-emitting direction d), in the light-emitting device of this embodiment.

Figure 5:
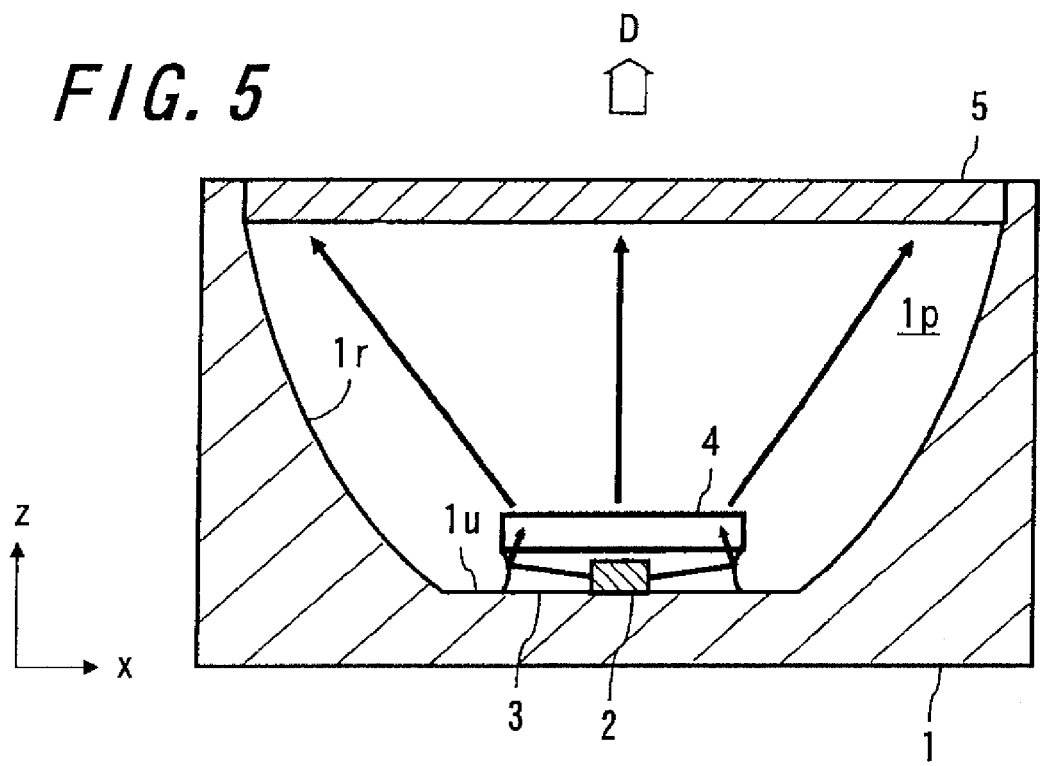
FIG. 5 is a cross-sectional view illustrating an optical function in the first embodiment.

Hereinafter, reflection of light at the side surface of the transparent member 3 will be described. As illustrated in FIGS. 4 and 5, light emitted from the side surface 2s of the light-emitting chip 2 is reflected by the side surface 3a of the transparent member 3, and travels to the bottom surface of the optical member 4 (the face of the optical member 4 on the side of the light-emitting chip 2). Then, the light traveling through the interior of the optical member 4 further travels from an upper surface 4u of the optical member 4 (the face of the optical member 4 in the light-emitting direction D) to the upper part of the opening part 1p, and is emitted out of the light-emitting device.

In this embodiment, among light emitted laterally from the light-emitting chip, light that would be absorbed by a light-reflecting surface when reflected by the light-reflecting surface in the configuration of a conventional light-emitting device, is reflected as described above by the face $3s$ functioning as the interface between the transparent member 3 and the exterior of the transparent member 3. Here, comparison between the loss of light occurring when light is reflected by the light-reflecting surface in the conventional configuration and the loss of light occurring when light is reflected by the side surface $3s$ of the transparent member of the invention, shows that the loss of light at the side surface $3s$ of the transparent member 3 is smaller. Thus, the light-emitting device of this embodiment has higher light output. In particular, in a case where the first light generated by the light-emitting chip 2 is ultraviolet light, the loss of light at the light-reflecting surface in the conventional light-emitting device is larger than that in a case where the first light is visible light. The light-emitting device of this embodiment has higher luminance of emitted light also in a case where a light-emitting chip that emits ultraviolet light is used.

In this embodiment, the side surface $3s$ of the transparent member 3 has a concave surface. With this configuration, in the light-emitting device of this embodiment, total reflection of light emitted laterally from the light-emitting chip 2 occurs more easily at the side surface $3s$ of the transparent member 3, and thus the efficiency in collecting light from the light-emitting chip 2 to the optical member 4 is improved.

Figure 6:
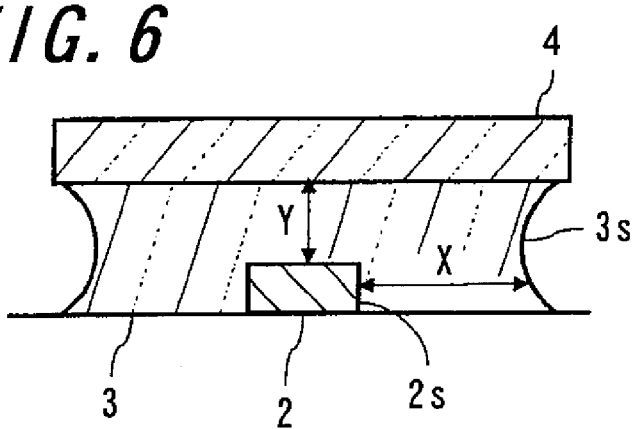
FIG. 6 is a cross-sectional view illustrating a configuration of the transparent member 3 in the first embodiment.

In this embodiment, the transparent member 3 is disposed between the top $2t$ of the light-emitting chip 2 and the bottom surface of the optical member 4. As illustrated in FIG. 6, a thickness X of the transparent member 3 positioned on the side surface $2s$ of the light-emitting chip 2 is larger than a thickness Y of the transparent member 3 positioned between the light-emitting chip 2 and the optical member 4. With this configuration, the area where the transparent member 3 and the optical member 4 are connected is larger than the area of the side surface $3s$ of the transparent member 3. Accordingly, the amount of light (primary light) that is directly incident on the optical member 4 is larger than the amount of light reflected by the side surface $3s$ of the transparent member 3, among light emitted from the light-emitting chip 2. Accordingly, the light emitted from the light-emitting chip 2 is efficiently guided in the light-emitting direction D of the light-emitting device, and thus the luminance of light emitted by the light-emitting device is improved. In a case where the thickness X is at least twice the thickness Y, the area where the transparent member 3 and the optical member 4 are connected is larger than the area of the side surface $3s$ of the transparent member 3.

The optical member 4 is disposed above the light-emitting chip 2 (in the light-emitting direction D of the light-emitting device), and is made of a light-transmitting material such as resin or glass. Here, being light-transmitting refers to a property that allows light having at least part of wavelengths of the light generated by the light-emitting chip 2 to pass.

The optical member 4 and the transparent member 3 are transparent or semitransparent to light in the range of 380 to 830 nm. Here, being transparent to light in the range of 380 to 830 nm refers to a state in which the transmittance of light in the range of 380 to 830 nm is 80 to 100%, and being semitransparent to light in the range of 380 to 830 nm refers to a state in which the transmittance of light in the range of 380 to 830 nm is 50 to 80%.

The optical member 4 has a function to diffusely radiate light which is emitted from the light-emitting chip 2 and guided by the transparent member 3, in the light-emitting direction D. In this embodiment, the optical member 4 has the shape of a flat plate, and diffusely emits light which is emitted from the light-emitting chip 2 and guided by the transparent member 3, upward (in the direction toward the wavelength converter 5). In another exemplary configuration, the optical member 4 has an convex upper surface, and emits light which is emitted from the light-emitting chip 2 and guided by the transparent member 3, upward (in the direction toward the wavelength converter 5).

The optical member 4 diffusely guides light generated by the light-emitting chip 2, in the light-mitting direction D. Thus, point emission caused by the light-emitting chip 2 is changed into surface emission, and unevenness of light emission at the light-emitting surface of the light-emitting device is reduced.

In this embodiment, the wavelength converter 5 has the sheet shape. The wavelength converter 5 (the wavelength-converting means) converts the wavelength of light generated by the light-emitting chip 2 and emits the wavelength-converted light. In the configuration illustrated in FIG. 1, the wavelength converter 5 is disposed above the light-emitting chip 2, and covers the opening part $1p$ of the base 1. The wavelength converter 5 is made of a resin which is mixed with a fluorescent material. The wavelength converter 5 has a function to convert the first light emitted from the light-emitting chip 2, into second light having a peak wavelength in a second wavelength range that is different from the wavelength range of the first light, and to output the second light.

The light-emitting device of the invention outputs white light. Examples of the combination of the light-emitting chip 2 and the fluorescent material include the following. In a case where the light-emitting chip 2 generates first light having at least part of wavelengths in the range of 440 to 470 nm (blue), a fluorescent material is used that radiates second light having at least part of wavelengths in the range of 565 to 590 nm (yellow), which has a complementary relationship with the color of the light emitted by the light-emitting chip 2. This fluorescent material is preferably $(Y,Gd)_3(Al,Ga)_5O_{12}:Ce$ or the like. In the case of this combination of the light-emitting chip 2 and the fluorescent material, the light-emitting device emits white light that is light in which the blue light that is generated by the light-emitting chip 2 and passes through the wavelength converter 5 and the yellow light that is emitted from the wavelength converter 5 are mixed.

Other examples of the combination of the light-emitting chip 2 and the fluorescent material include the following. In a case where the light-emitting chip 2 generates first light having at least part of wavelengths in the range of 440 to 470 nm (blue), a fluorescent material is used that radiates second light having at least part of wavelengths in the range of 520 to 565 nm (green) and third light having at least part of wavelengths in the range of 625 to 740 nm (red). In the case of this combination of the light-emitting chip 2 and the fluorescent material, the light-emitting device emits white light that is light in which the blue light that is generated by the light-emitting chip 2 and passes through the wavelength converter 5 and the green light and the red light that are emitted from the wavelength converter 5 are mixed.

Other examples of the combination of the light-emitting chip 2 and the fluorescent material include the following. In a case where the light-emitting chip 2 generates first light having at least part of wavelengths in the range of 210 to 400 nm (ultraviolet light), a fluorescent material is used that emits second light having at least part of wavelengths in the range of 440 to 470 nm (blue), third light having at least part of wavelengths in the range of 520 to 565 nm (green), and fourth light having at least part of wavelengths in the range of 625 to 740 nm (red). In the case of this combination of the light-emitting chip 2 and the fluorescent material, the light-emitting device emits white light that is light in which the blue light, the green light, and the red light that are emitted from the wavelength converter 5 are mixed.

In this embodiment, the light-emitting surface (an upper surface of the wavelength converter 5) of the light-emitting device is parallel to the surface of the optical member 4 positioned on the side of the light-emitting surface. With this configuration, the distance from the upper surface of the optical member 4 to the light-emitting surface of the light-emitting device is uniform across the face. Accordingly, the optical path length of light emitted from the optical member 4 in the light-emitting direction D becomes uniform, and thus intensity unevenness and color unevenness of light on the light-emitting surface are reduced.

Figure 7:
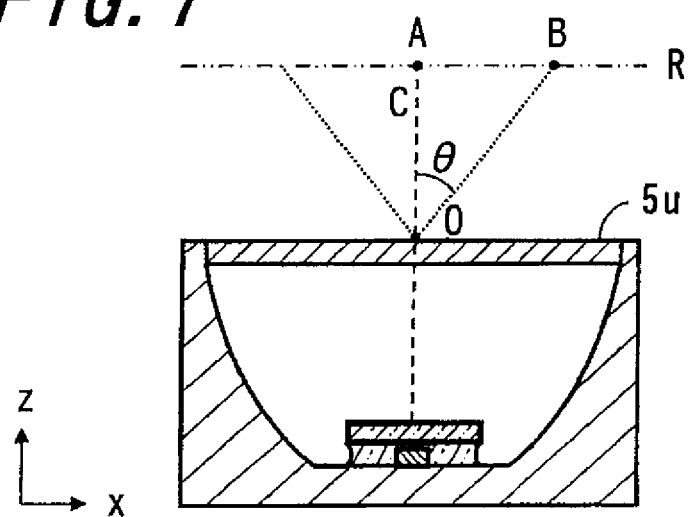
FIG. 7 is a cross-sectional view illustrating optical properties in the first embodiment.

The light-emitting device of this embodiment has the configuration in which light generated by the light-emitting chip 2 is guided upward by means of total reflection of light at the side surface 3s of the transparent member 3. Thus, the light-emitting device has a half-value angle θ of 30 to 70 degrees with respect to an optical axis (central axis) C of a light-emitting surface 5u. Here, as illustrated in FIG. 7, the half-value angle θ refers to an angle θ formed by a point A on the optical axis C at which the intensity of emitted light has a peak on a virtual lighting region R, a point B at which the intensity of emitted light is half the peak value on the virtual lighting region R, and a point O on the optical axis C on the light-emitting surface 5u.

Hereinafter, a method for manufacturing the light-emitting device of this embodiment will be described with reference to FIG. 8. The method for manufacturing the light-emitting device of this embodiment comprises steps (a) to (e) below. Steps (a) to (e) illustrated in FIG. 8 correspond to steps (a) to (e) described below.

(a) The light-emitting chip 2 is mounted on the bottom surface 1u of the opening part 1p of the base 1.

(b) The transparent member 3 made of a silicone resin or the like is applied by potting or spraying from above the light-emitting chip 2 to the bottom surface 1u on which the light-emitting chip 2 has been mounted, and thus the light-emitting chip 2 is sealed with the molten transparent member 3.

(c) The optical member 5 made of glass or the like that has been molded in advance is placed on the molten transparent member 3. At that time, the transparent member 3 spreads in a molten state across the bottom surface of the optical member 5, and the side surface 3s of the transparent member 3 comes to have a concave surface.

(d) The transparent member 3 is heated or dried to be cured.

(e) The wavelength converter 5 is placed at the opening part 1p of the base 1.

In step (b), a frame member for molding the transparent member 3 to a desired shape may be provided on the bottom surface 1u, and the interior of the frame member may be filled with the molten transparent member 3.

(Second Embodiment)

Figure 9:
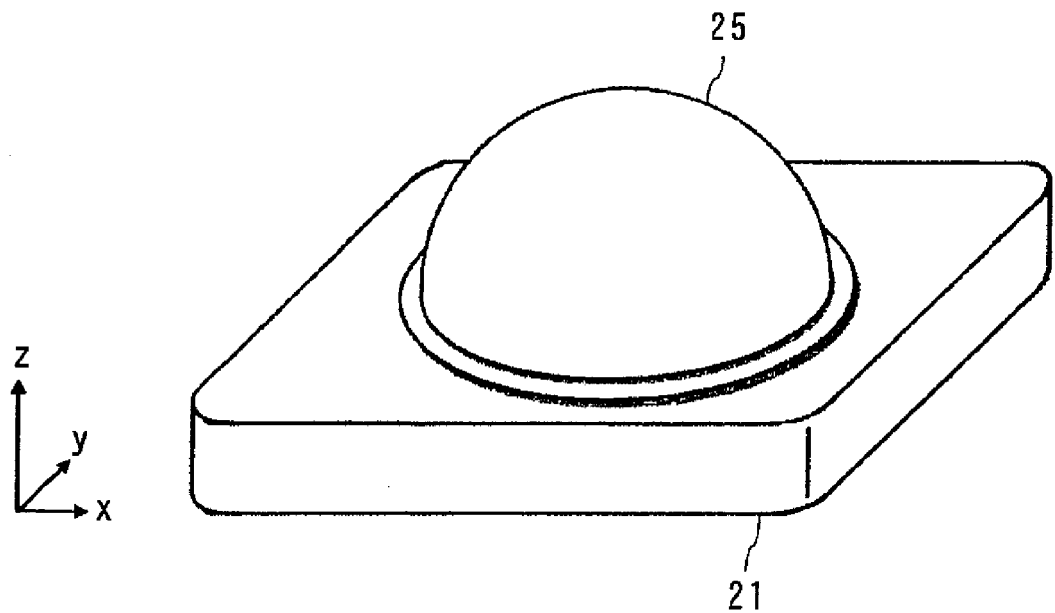
FIG. 9 is a perspective view illustrating a configuration of a second embodiment.
Figure 10:
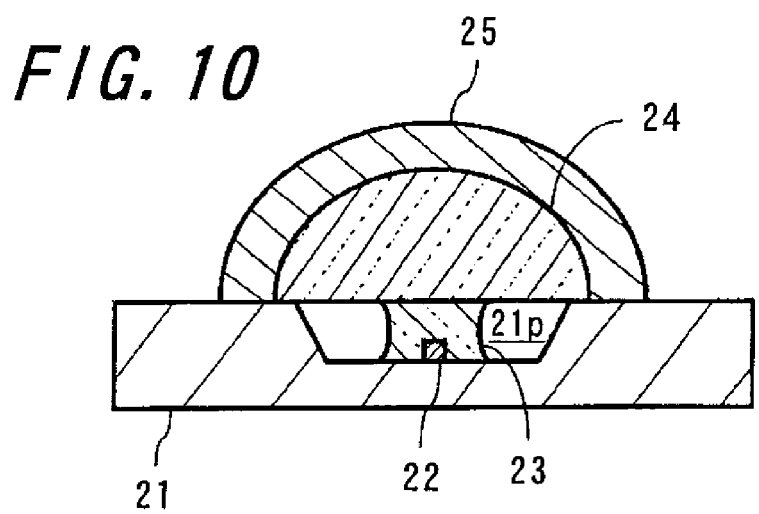
FIG. 10 is a cross-sectional view illustrating a configuration of the second embodiment.
Figure 13:
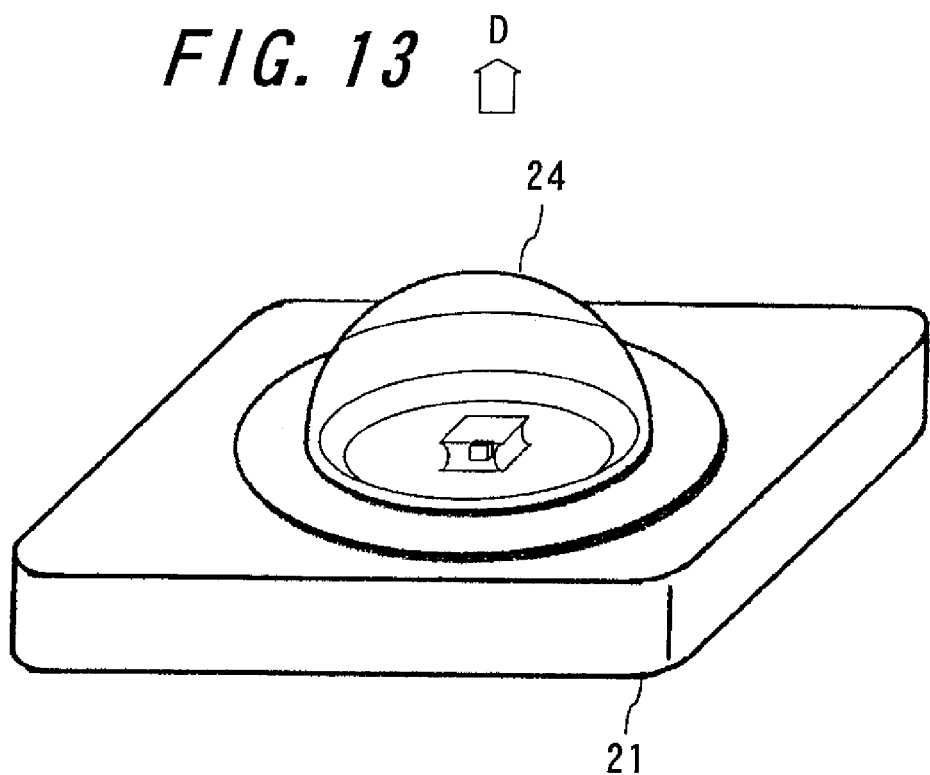
FIG. 13 is a perspective view illustrating a configuration of an optical member 24 in the second embodiment.

A second embodiment of the invention will be described. FIG. 9 is a perspective view illustrating the configuration of a light-emitting device according to the second embodiment. FIG. 10 is a cross-sectional view illustrating the configuration of the light-emitting device according to this embodiment. FIG. 11 is a perspective view illustrating the configuration of a base 21 in this embodiment. FIG. 12 is a perspective view illustrating the configuration of a transparent member 23 in this embodiment. FIG. 13 is a perspective view illustrating the configuration of an optical member 24 in this embodiment.

The light-emitting device of this embodiment includes the base 21, a light-emitting chip (light source) 22 that is mounted on the base 21, the transparent member 23 that covers the light-emitting chip 22, and the optical member 24 that is disposed on the transparent member 23. The light-emitting device of this embodiment further includes a wavelength converter (wavelength-converting means) 25 that covers the optical member 24. Here, covering the optical member 24 refers to a state in which the wavelength converter 25 is disposed at a position where light emitted from the optical member 24 reaches.

As illustrated in FIG. 11, the base 21 has an opening part 21p constituted by a light-reflecting surface 21r and a bottom surface 1u. Here, the light-reflecting surface 21r of the base 21 reflects light having at least part of wavelengths of the light generated by the light-emitting chip 22, in a light-emitting direction D. The light-emitting direction D refers to a direction in which light outputted from the light-emitting device travels, and is the upward direction in FIG. 9 (the positive direction in the z axis of the virtual xyz coordinate). In FIG. 9, the light-emitting device is illustrated in a state where the light-emitting device is mounted on the xy plane of the virtual xyz coordinate.

The light-emitting chip 22 is mounted on the bottom surface 21u of the opening part 21p of the base 21 as illustrated in FIG. 12, and emits light at least from a side surface, as in the configuration of the first embodiment. As illustrated in FIG. 12, the transparent member 23 covers the light-emitting chip 22, and is disposed on the bottom surface 21u of the opening part 21p in a state where the transparent member 23 is apart from the light-reflecting surface 21r of the opening part 21p, as in the configuration of the first embodiment. Here, covering the light-emitting chip 22 refers to a state in which the transparent member 23 covers at least part of the side surface of the light-emitting chip 22. In the configuration illustrated in FIG. 12, the transparent member 23 surrounds the side surface and a top of the light-emitting chip 22. The transparent member 23 has a side surface and an upper surface that adheres to the optical member 24, and has a function to guide light emitted from the side surface of the light-emitting chip 22, in the light-emitting direction D. The side surface of the transparent member 23 is light-reflecting means having a function to guide light emitted from the side surface of the light-emitting chip 22 by means of total reflection in the light-emitting direction D. The side surface of the transparent member 23 is in contact with a space (an air layer) having a refractive index smaller than that of the transparent member 23.

As illustrated in FIG. 13, the optical member 24 is disposed above the light-emitting chip 22 (in the light-emitting direction D of the light-emitting device), as in the configuration of the first embodiment. Here, transparent refers to a property that allows light having at least part of wavelengths of the light generated by the light-emitting chip 2 to pass. The optical member 24 has a function to diffusely emit light emitted from the light-emitting chip 22 and guided by the transparent member 23, in the light-emitting direction D.

In this embodiment, the optical member 24 may have a dome-shaped upper surface, and emits light which is emitted from the light-emitting chip 22 and guided by the transparent member 23, to the wavelength converter 25. In this embodiment, the optical member 24 is adhered to the transparent member 23 and placed on the surface of the base 21. The optical member 24 diffusely guides light generated by the light-emitting chip 22, to the wavelength converter 25. Thus, point emission caused by the light-emitting chip 22 is changed into surface emission, and unevenness of light emission at the light-emitting surface of the light-emitting device is reduced.

In this embodiment, the wavelength converter 25 has the dome shape, and is adhered to the upper surface of the transparent member 24. The wavelength converter 25 covers the transparent member 24 and is attached to the base 21. The wavelength converter 25 converts the wavelength of light generated by the light-emitting chip 22 and guided by the transparent member 24, and emits the wavelength-converted light. The optical properties of the light-emitting chip 22 and examples of the fluorescent material in the wavelength converter 25 are similar to those in the first embodiment.

Figure 14:
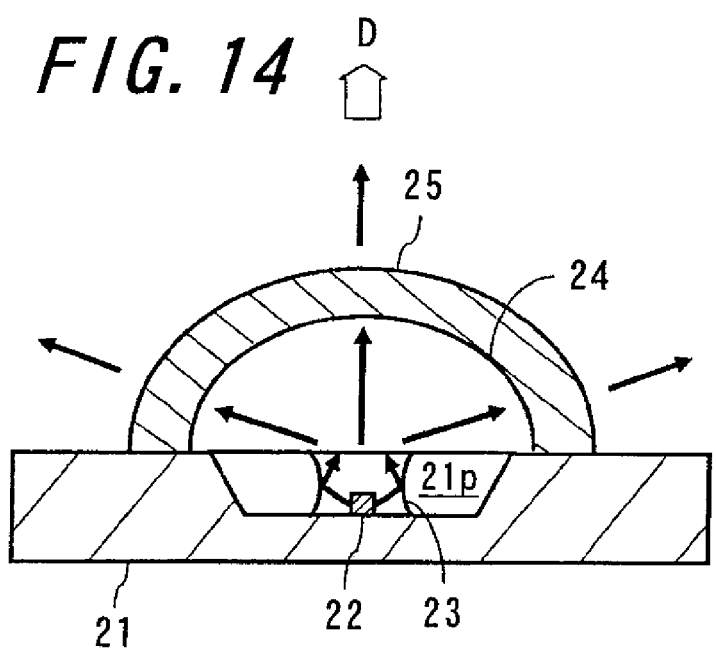
FIG. 14 is a cross-sectional view illustrating an optical function in the second embodiment.

Hereinafter, the function of the light-emitting device of this embodiment will be described with reference to FIG. 14. Light emitted from the side surface of the light-emitting chip 22 is totally reflected by the side surface of the transparent member 23, to be guided to the optical member 24. The light guided to the optical member 24 is emitted by the optical member 24 to the wavelength converter 25. The light emitted to the wavelength converter 25 is converted by the wavelength converter 25 to have a different wavelength, and emitted out of the light-emitting device.

In this manner, in the light-emitting device of this embodiment, light generated by the light-emitting chip 22 is guided to the optical member 24 by means of total reflection of light occurring due to a difference between the refractive indexes of the interior and the exterior of the transparent member 23. Accordingly, the efficiency in collecting light from the light-emitting chip 22 to the wavelength converter 25 is improved, and thus the luminance of emitted light is improved.

Furthermore, in the light-emitting device of this embodiment, the optical member 24 has a dome-shaped upper surface. Accordingly, unevenness of the amount of light guided to the wavelength converter 25 is reduced, and unevenness of the color of emitted light is reduced.

(Third Embodiment)

Figure 15:
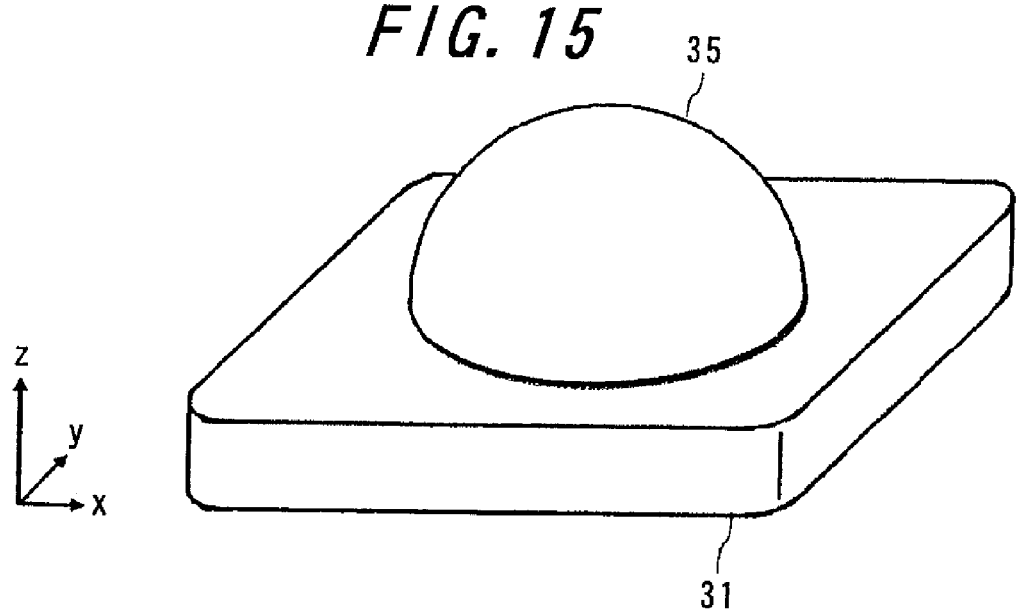
FIG. 15 is a perspective view illustrating a configuration of a third embodiment.
Figure 16:
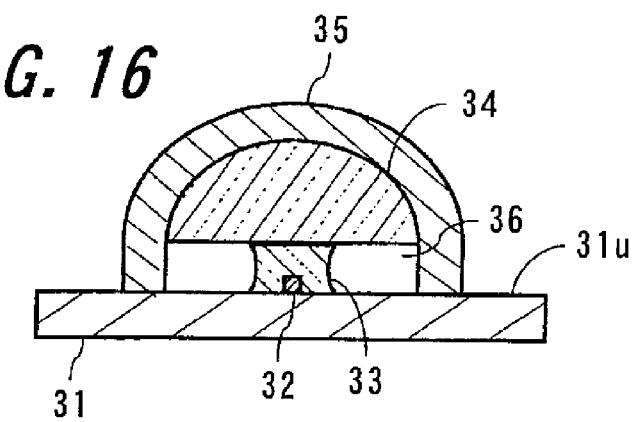
FIG. 16 is a cross-sectional view illustrating a configuration of the third embodiment.
Figure 17:
FIG. 17 is a perspective view illustrating a configuration of a transparent member 33 in the third embodiment.
Figure 18:
FIG. 18 is a perspective view illustrating a configuration of an optical member 34 in the third embodiment.

A third embodiment of the invention will be described. FIG. 15 is a perspective view illustrating the configuration of a light-emitting device according to the third embodiment. FIG. 16 is a cross-sectional view illustrating the configuration of the light-emitting device of this embodiment. FIG. 17 is a perspective view illustrating the configuration of a transparent member 33 of this embodiment. FIG. 18 is a perspective view illustrating the configuration of an optical member 34 in this embodiment.

The light-emitting device of this embodiment includes a base 31, a light-emitting chip (light source) 32 that is mounted on the base 31, the transparent member 34 that covers the light-emitting chip 32, and the optical member 35 that is disposed on the transparent member 34. The light-emitting device of this embodiment further includes a wavelength converter 35 that covers the transparent member 33 and the optical member 34. Here, covering the transparent member 33 refers to a state in which the wavelength converter 35 is disposed at a position where light that is generated by the light-emitting chip 32 and passes through the transparent member 33 reaches. Covering the optical member 34 refers to a state in which the wavelength converter 35 is disposed at a position where light emitted from the optical member 34 reaches.

The configuration of this embodiment is different from that of the second embodiment, in that the wavelength converter 35 is disposed on the same surface (an upper surface 31u) of the base 31 on which the light-emitting chip 32 is mounted. The rest of the configuration of this embodiment is similar to that in the second embodiment.

The transparent member 33 covers the light-emitting chip 32, and is disposed on the upper surface 31u of the base 31. Here, covering the light-emitting chip 32 refers to a state in which the transparent member 33 covers at least part of a side surface of the light-emitting chip 32. In the configuration illustrated in FIG. 17, the transparent member 33 surrounds the side surface and a top of the light-emitting chip 32. The transparent member 33 has a side surface that guides light emitted from the side surface of the light-emitting chip 32 by means of total reflection to the optical member 34 and an upper surface that adheres to the optical member 34.

The optical member 34 is adhered to the upper surface of the transparent member 33 in a state where the optical member 34 is raised from the upper surface 31u of the base 31 by a thickness H of the transparent member 33. The optical member 34 has a dome-shaped upper surface.

The wavelength converter 35 surrounds the transparent member 33, via a transparent layer 36 which is interposed between the wavelength converter 35 and the transparent member 33 and which has a refractive index smaller than that of the transparent member 33. Here, surrounding the transparent member 33 refers to a state in which the wavelength converter 35 is disposed at a position where light that is generated by the light-emitting chip 32 and passes through the transparent member 33 reaches. In the configuration illustrated in FIG. 19, the transparent layer 36 is an air layer. Here, transparency of layer 36 refers to a state in which light having at least part of wavelengths of the light generated by the light-emitting chip 32 is allowed to pass therethrough. Other examples of the transparent layer 36 include a layer made of a resin material having a refractive index smaller than that of the transparent member 33.

Figure 19:
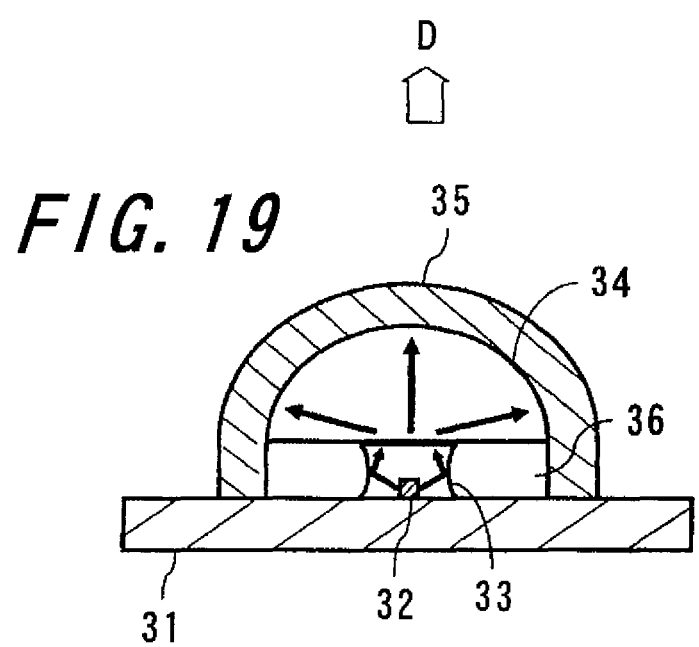
FIG. 19 is a cross-sectional view illustrating an optical function in the third embodiment.

As illustrated in FIG. 19, in the light-emitting device of this embodiment, light emitted from the light-emitting chip is reflected by the side surface of the transparent member 33, to be guided to the optical member 34. Accordingly, the efficiency in collecting light from the light-emitting chip 32 to the wavelength converter 35 is improved, and thus the luminance of emitted light is improved.

The light-emitting device of this embodiment has the configuration in which light generated by the light-emitting chip 32 is guided via the transparent member 33 to the optical member 34, and then emitted from the optical member 34 to the wavelength converter 35. Thus, unevenness of the color of emitted light is reduced compared with the configuration in which light generated by a light-emitting chip directly reaches a wavelength converter.

(Fourth Embodiment)

A fourth embodiment of the invention will be described. FIG. 20(*a*) is a cross-sectional view illustrating the configuration of an optical member, in the fourth embodiment of the light-emitting device of the invention. This light-emitting device is different from that illustrated in the first embodiment, in that the outer peripheral portion of an optical member 44 is positioned beyond the transparent member 3. More specifically, in the transparent plan view of the light-emitting device (transparent view of the light-emitting device from the side of a light-emitting surface) illustrated in FIG. 20(*b*), an outer edge of the optical member 44 is positioned beyond an outer edge of the transparent member 3.

In this embodiment, the transparent member 3 can be prevented from moving upward to the upper surface of the optical member 44. Accordingly, the optical member 44 is hardly inclined, and thus unevenness of the intensity of light at the light-emitting surface of the light-emitting device is reduced.

(Fifth Embodiment)

A fifth embodiment of the invention will be described. FIG. 20 is a perspective view illustrating an optical member, in the fifth embodiment of the light-emitting device of the invention. The light-emitting device is different from that illustrated in the first embodiment, in that a convex portion 57 is positioned at the central portion of the upper surface of an optical member 54. That is, in the light-emitting device in this embodiment, the thickness of the central region of the optical member 54 is larger than that of the outer peripheral region. The rest of the configuration of this embodiment is similar to that in the first embodiment.

In this embodiment, even in a case where the transparent member 3 that has not been cured moves upward to the upper surface of the optical member 54, the transparent member 3 is hardly attached to the convex portion 57 functioning as the light-emitting surface of the optical member 54. Accordingly, light absorption caused by the transparent member 3 attached to the light-emitting surface of the optical member 54 is reduced, and thus the luminance of emitted light is improved.

(Sixth Embodiment)

A sixth embodiment of the invention will be described. FIG. 22 is a cross-sectional view illustrating an optical member in the light-emitting device according to the fourth embodiment of the invention. In the light-emitting device, a light-transmitting protective film 68 is formed on a face of an optical member 64 on the side of the light-emitting chip 2 (the lower face of the optical member 64 in FIG. 22).

As this protective film 68, inorganic insulating films (SiN film, SING film, etc.), thin films mainly made of carbon (DLC film, CN film, and amorphous carbon film), metal oxide films (WO2, CaF2, Al2O3, etc.) and the like can be used. In particular, in a case where an SiN film is used, the light-emitting chip 2 can be protected from moisture, and thus the reliability of the operation of the light-emitting device is improved.

In FIG. 22, the structure was illustrated in which the protective film 68 covers only the lower face of the optical member 64, but another structure is also possible, for example, in which the protective film 68 covers the lower face of the optical member 64 and the side surface of the transparent member 3 as illustrated in FIG. 23. With this structure, the influence of moisture on the light-emitting chip 2 is further reduced. As the protective film 68 used in FIG. 23, a material is used that causes total reflection of light emitted from the side surface of the light-emitting chip 2, at the side surface of the transparent member 3 or the surface of the protective film 68.

(Seventh Embodiment)

Figure 24:
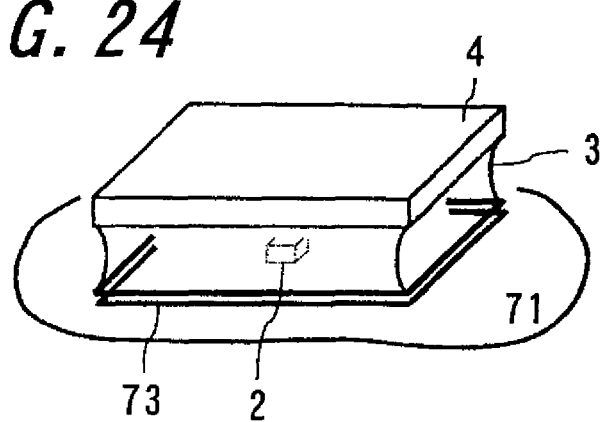
FIG. 24 is a perspective view illustrating a configuration of a seventh embodiment.

A seventh embodiment of the invention will be described. FIG. 24 is a view illustrating the configuration of a base 71 in the light-emitting device according to the seventh embodiment of the invention. In this light-emitting device, a recessed portion 73 is provided in a region of the base 71 in which the transparent member 3 is disposed. In FIG. 24, the recessed portion 73 is formed on the surface of the base 71 positioned at the outer periphery of the region to which the transparent member 3 is connected. With this configuration, spread of the transparent member 3 in a molten state on the surface of the base 71 is reduced. Thus, the shape of the transparent member 3 can be a desired shape, and the luminance of emitted light is improved. The cross section of the recessed portion 73 is in the shape of a rectangle. In another example, the cross section of the recessed portion 73 is in the shape of a curved face. In a case where the cross section of the recessed portion 73 is in the shape of a curved face, the transparent member 3 that flows in the recessed portion 73 is placed along the inner face of the recessed portion 73, and thus the amount of air bubbles (gas) that are mixed in the transparent member 3 is reduced. Accordingly, separation between the base 71 and the transparent member 3 hardly occurs.

(Eighth Embodiment)

Figure 25:
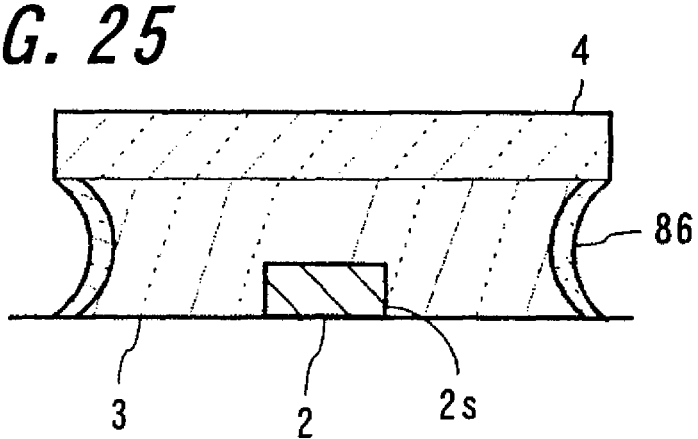
FIG. 25 is a cross-sectional view illustrating a configuration of an eighth embodiment.

An eighth embodiment of the invention will be described. FIG. 25 is a view illustrating the configuration of the light-emitting device according to the tenth embodiment of the invention. A second transparent member 86 that covers the side surface of the first transparent member 3 and that has a refractive index smaller than that of the first transparent member 3, is provided between the inner circumferential face of the opening part of the base 1 and the first transparent member 3.

In this embodiment, in a case where the refractive index of the first transparent member 3 is taken as n1, the refractive index of the second transparent member 86 is taken as n3, and the refractive index of the space between the second transparent member 86 and the inner circumferential face of the opening part is taken as n2, the refractive indexes n1, n2, and n3 satisfy the relationship $n1>n3>n2$.

Both the second transparent member 86 and the first transparent member 3 are attached to the lower face of the optical member 4. With this configuration, in the light-emitting device of this embodiment, light passing through the first transparent member 3 without being reflected by the side surface of the first transparent member 3 is reflected by the side surface of the second transparent member 86, to be guided to the optical member 4.

The invention claim is:

1. A light-emitting device comprising:
   a base having an opening part which includes a light-reflecting surface and a bottom surface;
   a light-emitting chip mounted on the bottom surface of the opening part;
   a transparent member covering the light-emitting chip and disposed on the bottom surface of the opening part in a state where the transparent member is apart from the light-reflecting surface of the opening part; and
   an optical member disposed on the transparent member,
   wherein the transparent member surrounds a side surface and a top of the light-emitting chip,
   wherein the transparent member has a larger thickness on a side of the side surface of the light-emitting chip than a thickness on a side of the top of the light-emitting chip.

2. A light-emitting device comprising:
   a base having an opening part which includes a light-reflecting surface and a bottom surface;
   a light-emitting chip mounted on the bottom surface of the opening part;
   a transparent member covering the light-emitting chip and disposed on the bottom surface of the opening part in a state where the transparent member is apart from the light-reflecting surface of the opening part; and
   an optical member disposed on the transparent member,
   wherein the transparent member surrounds a side surface and a top of the light-emitting chip,
   wherein a light emitted from the side surface of the light-emitting chip travels in a light-emitting direction by the transparent member.

3. A light-emitting device comprising:
   a base having an opening part which includes a light-reflecting surface and a bottom surface;
   a light-emitting chip mounted on the bottom surface of the opening part;
   a transparent member covering the light-emitting chip and disposed on the bottom surface of the opening part in a state where the transparent member is apart from the light-reflecting surface of the opening part; and an optical member disposed on the transparent member, wherein the transparent member surrounds a side surface and a top of the light-emitting chip, wherein the transparent member has a side surface and an upper surface adhering to the optical member, wherein the side surface of the transparent member guides a light emitted from the side surface of the light-emitting chip by total reflection in a light-emitting direction.

4. A light-emitting device comprising:

a base having an opening part which includes a light-reflecting surface and a bottom surface;

a light-emitting chip mounted on the bottom surface of the opening part;

a transparent member covering the light-emitting chip and disposed on the bottom surface of the opening part in a state where the transparent member is apart from the light-reflecting surface of the opening part, an optical member disposed on the transparent member; and a wavelength converter covering the optical member, wherein the wavelength converter has a dome shape.

5. The light-emitting device according to claim 4, wherein the optical member has a dome-shaped upper surface attached to the wave length converter.

6. A light-emitting device comprising:

a base;

a light-emitting chip mounted on the base;

a transparent member disposed on the base and covering the light-emitting chip;

an optical member disposed on the transparent member; and a wavelength converter disposed on the base and covering the optical member and the transparent member, the wavelength converter surrounding the transparent member via a transparent layer which is interposed between the wavelength converter and the transparent member and which has a refractive index smaller than the transparent member.

7. The light-emitting device according to claim 6, wherein the wavelength converter has a dome shape, and the optical member has a dome-shaped upper surface adhered to the wavelength converter.

8. The light-emitting device according to claim 6, wherein The transparent layer is an air layer.

9. The light-emitting device according to claim 6, wherein the transparent layer is made of a resin material.

\* \* \* \* \*